United States Patent
Werth

(10) Patent No.: US 9,857,438 B2
(45) Date of Patent: Jan. 2, 2018

(54) MAGNETORESISTIVE DEVICES

(71) Applicant: Infineon Technologies AG, Neubiberg (DE)

(72) Inventor: Tobias Werth, Villach (AT)

(73) Assignee: Infineon Technologies AG, Neubiberg (DE)

( * ) Notice: Subject to any disclaimer, the term of this patent is extended or adjusted under 35 U.S.C. 154(b) by 17 days.

(21) Appl. No.: 14/691,054

(22) Filed: Apr. 20, 2015

(65) Prior Publication Data
US 2016/0306016 A1      Oct. 20, 2016

(51) Int. Cl.
*G01R 33/02*        (2006.01)
*G01R 33/09*        (2006.01)

(52) U.S. Cl.
CPC .......... *G01R 33/09* (2013.01); *G01R 33/093* (2013.01); *G01R 33/098* (2013.01)

(58) Field of Classification Search
CPC ...... G01R 33/09; G01R 33/091; G01R 33/02; G01R 33/093
USPC ......................................................... 324/252
See application file for complete search history.

(56) References Cited

U.S. PATENT DOCUMENTS

| | | | | |
|---|---|---|---|---|
| 6,304,074 B1 * | 10/2001 | Waffenschmidt | ........ | G01B 7/30 324/202 |
| 6,822,443 B1 * | 11/2004 | Dogaru | ................ | G01R 33/093 324/235 |
| 7,141,967 B2 * | 11/2006 | Butzmann | ............... | G01P 3/488 324/207.21 |
| 2005/0258820 A1 | 11/2005 | Forster | | |
| 2014/0232379 A1 | 8/2014 | Nazarian et al. | | |

* cited by examiner

*Primary Examiner* — Reena Aurora
(74) *Attorney, Agent, or Firm* — Schiff Hardin LLP

(57) ABSTRACT

Magnetoresistive devices can include a first and second sensor. Each of the first and second sensors can be configured to sense a first magnetic field component and a second magnetic field component. The first and second magnetic field components may be orthogonal to each other. Signals generated by the first and/or the second sensors can be used to determine local or global differentials of the magnetic field components. The first and/or the second sensors can each include four magnetoresistive sensors that can be connected in a Wheatstone bridge configuration. Further, the magnetoresistive devices can include magnets having a cavity formed therein, where the dimensions of the cavity are configured to reduce magnetic field conditions of a magnetic field in proximity to and/or within the cavity.

18 Claims, 7 Drawing Sheets

MAGNETORESISTIVE DEVICES

BACKGROUND

Field

Embodiments described herein generally relate to magnetoresistive devices, including magnetoresistive sensors.

Related Art

Magnetoresistive devices may be based on one or more magnetoresistive technologies—including, for example, tunnel magnetoresistive (TMR), giant magnetoresistive (GMR), anisotropic magnetoresistive (AMR), and/or one or more other magnetoresistive technologies as would be understood by those skilled in the relevant art(s)—that may collectively be referred to as xMR technologies. The magnetoresistive technologies can be configured using various electrical contact configurations, for example, a current in plane (CIP) configuration or a current perpendicular to plane (CPP) configuration. In the CIP configuration, current flows parallel to the layer system of the magnetoresistive device between electrical contacts disposed on a same side of the device, whereas in the CPP configuration, current flows perpendicular to the layer system between electrical contacts disposed on opposing sides of the device.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

Figure 1:
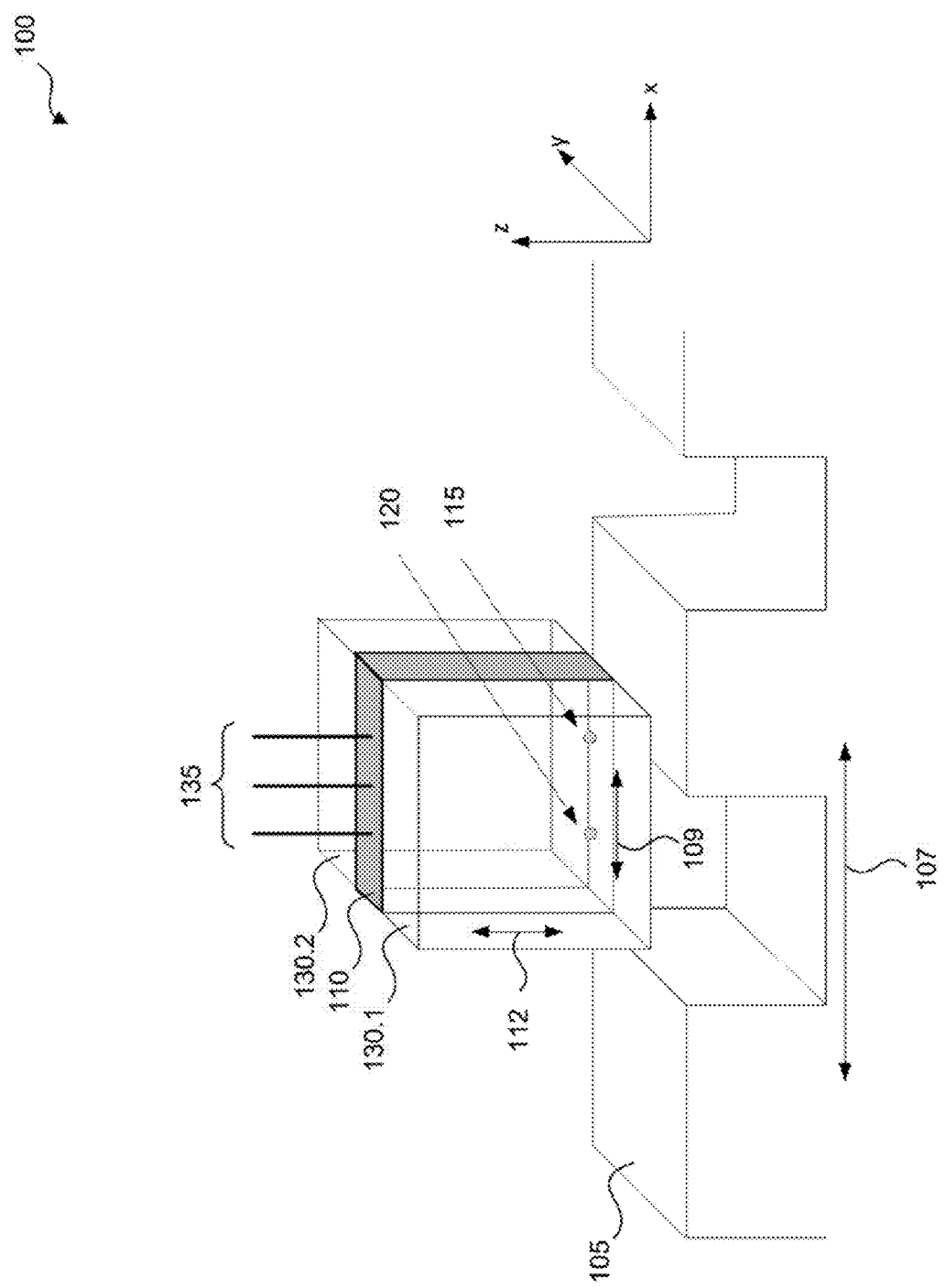
FIG. 1 illustrates magnetoresistive device according to an exemplary embodiment of the present disclosure.

Magnetoresistive devices can be used for rotational direction and/or rotational speed determinations. FIG. 1 illustrates a magnetoresistive device 100 according to an exemplary embodiment of the present disclosure. The magnetoresistive device 100 can include a magnetoresistive sensor package 110 disposed between first and second magnets 130.1 and 130.2. In an exemplary embodiment, the magnetoresistive sensor package 110 includes first sensor 115 and second sensor 120. The sensors 115 and 120 can each include processor circuitry configured to detect or sense one or more magnet field components and to generate one or more signals in response to the detected/sensed magnetic field component(s). The first and second sensors 115 and 120 can be spaced apart in, for example, the X-direction by a distance 109. The distance 109 can be referred to as the "sensor pitch" and can be, for example, 2 mm, a distance in the range of 1 to 3 mm, or another distance as would be understood by one of ordinary skill in the relevant arts. In this example, the sensors 115 and 120 can be located within the X-Y plane, which can be referred to as the sensing plane or sensing area. More specifically, a first sensing area is a portion of the sensing plane (e.g., the X-Y plane) where the sensors 115 are arranged. Similarly, a second sensing area may be defined where the sensors 120 are arranged. For the purposes of this discussion, the sensing plane can refer to the physical location of the sensors 115 and/or 120 (e.g., the X-Y plane), and/or can define the plane containing one or more magnetic field components to which the sensors 115 and/or 120 are sensitive, and hence configured to sense. For example, in some embodiments, the sensors 115 and 120 are configured to sense magnetic field components extending in the X-direction and the Z-direction, and the sensing plane can be the X-Z plane and the respective sensing areas would be portions of the X-Z plane.

The magnetoresistive sensor package 110 can include one or more leads 135 that are configured to communicatively couple the magnetoresistive sensor package 110 to one or more evaluating devices (not shown). The evaluating device(s) can include memory that stores data and/or instructions, and processor circuitry that is configured to process one or more signals generated by and/or received from the first sensor 115 and/or the second sensor 120. The signals can correspond to sensed magnetic field components and/or changes in such magnetic field components. The processor circuitry can also be configured to determine rotational direction and/or rotational speed of an indicator object 105 (discussed in more detail below) based on the processed signal(s). The magnetoresistive device 100 can include one or more evaluating devices configured to process one or more signals and perform one or more determinations discussed herein.

Signals from the first sensor 115 and the second sensor 120 can be used to determine one or more magnetic field differentials between magnetic field components sensed by the first sensor 115 and the second sensor 120. In these examples, the magnetic field differentials can be referred to as "global differentials."

Further, in exemplary embodiments where the first sensor 115 includes two or more magnetoresistive sensors, signals from the first sensor 115 can be used to determine a magnetic field differential between the two (or more) magnetic field components sensed by the two (or more) magnetoresistive sensors within the first sensing area, respectively. Similarly, signals from the second sensor 120 can be used to determine a magnetic field differential between the two (or more) magnetic field components sensed by the two (or more) magnetoresistive sensors of the second sensor 120 within the second sensing area. In these examples, the magnetic field differentials can be referred to as "local differentials."

The magnets 130 can be back-biasing magnets configured to generate a magnetic field H that can be defined and/or influenced by an indicator object 105 arranged adjacent to, and spaced from the magnetoresistive device 100. The magnets 130 can be magnetized in the magnetization direction 112 that extends in the Z-direction. However, one or more of the magnets 130 can be magnetized in another direction as would be understood by one of ordinary skill in the relevant arts.

The first and second sensors 115 and 120 can include one or more magnetoresistive sensors configured to sense one or more magnetic field components (including changes in magnetic field component(s)) of one or more magnetic fields. The magnetoresistive sensors are described in more detail below with reference to FIGS. 2A-5. The first sensor 115 and/or second sensor 120 can be configured to sense first and second magnetic field components of the magnetic field H.

The first magnetic field component can be orthogonal (or substantially orthogonal) to the second magnetic field component. For example, the first magnetic field component can extend in the X-direction and the second magnetic field component can extend in the Z-direction, which is orthogonal to the X-direction. In this example, the first magnetic field component can be referred to as $H_X$ and the second magnetic field component can referred to as $H_Z$. In other embodiments, the first and second magnetic field components can extend in other directions as would be understood by one of ordinary skill in the relevant arts. That is, the first and second sensors 115 and 120 can each be configured to sense two or more different (angularly offset) magnetic field components that respectively extend in two or more other directions.

In operation, the first magnetic field component $H_X$ can pass substantially parallel to the relative direction of the indicator object 105, while the second magnetic field component $H_Z$ can pass substantially perpendicularly to the relative direction of the indicator object 105 and in the direction of the first and second sensors 115 and 120.

The indicator object 105 can be a toothed wheel or gear having protruding teeth and recessed depressions (e.g., gaps), and is configured to define and/or influence a magnetic field generated by the magnets 130. In operation, the indicator object 105 can move along direction 107 such that the teeth pass the magnetoresistive device 100 in the direction 107. It is to be understood that the movement may be a linear movement and/or a rotational movement. In an exemplary embodiment, the direction 107 extends along (or substantially along) the X-direction.

The indicator object 105 can be magnetized and configured to generate a magnetic field in addition to the magnetic field generated by the magnets 130. In these examples, the indicator object 105 can include magnetized poles (e.g., North and South poles) that generate one or more magnetic fields having one or more magnetic field components.

The indicator object 105 can be a pole wheel or pole bar having magnetized poles, where pole wheel/bar represents magnetic North and South Poles of a periodic permanently magnetized structure arranged next to each other.

For the purpose of this discussion, operation of magnetoresistive devices will be described using the indicator object 105 configured as a toothed wheel or gear. Therefore, the indicator object 105 will be referred to as toothed wheel 105. However, the indicator object 105 is not limited to the tooth wheel or gear configuration. The various embodiments described herein can alternatively use a pole wheel or pole bar configuration, or other indicator object configurations as would be understood by one of ordinary skill in the relevant arts.

The magnetoresistive device 100 can include the sensor package 110 disposed between (e.g., sandwiched by) the first and second magnets 130.1 and 130.2. In an exemplary embodiment, the magnetoresistive device 100 is vertically arranged in an X-Z plane such that the sensor package 110 is disposed between the first and second magnets 130.1 and 130.2 in the Y-direction. In this configuration, the magnetoresistive device 100 can be adjacent to the toothed wheel 105 and spaced from the toothed wheel 105 in the Z-direction. The magnetoresistive device 100 can be spaced from the toothed wheel 105 by a distance within the range of, for example, 0.1 to 5 mm, 0.5 to 2 mm, or another distance as would be understood by one of ordinary skill in the relevant arts.

An exemplary operation of the magnetoresistive device 100 and the toothed wheel 105 will be described with reference to FIGS. 2A-2C.

Figure 2A:
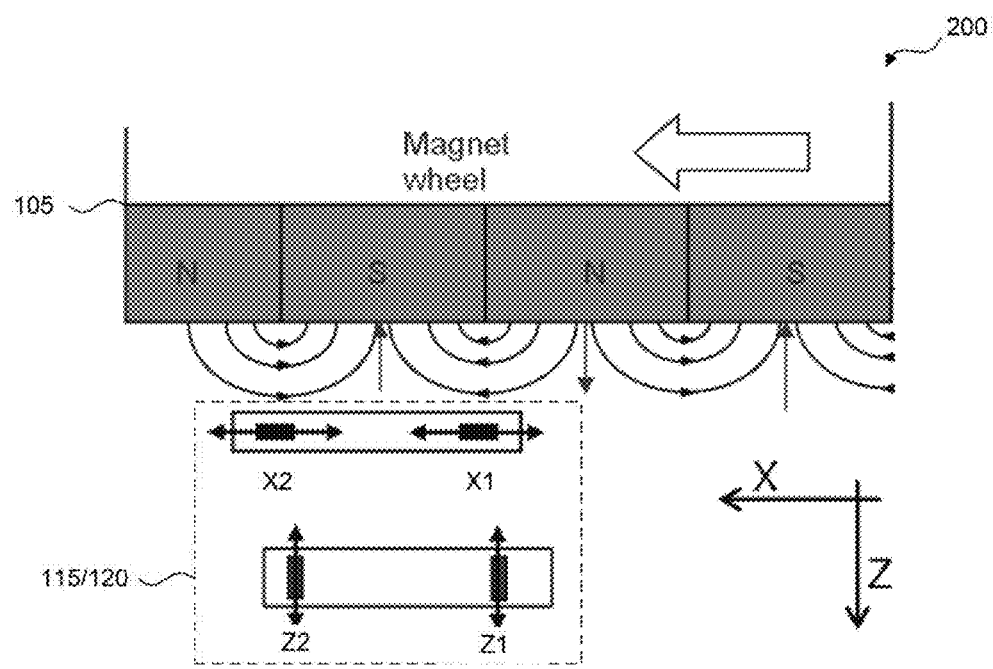
FIG. 2A illustrates an exemplary operation of the magnetoresistive device according to an exemplary embodiment of the present disclosure.

FIG. 2A illustrates an exemplary operation of the magnetoresistive device 100 according to an exemplary embodiment of the present disclosure. FIGS. 2B and 2C illustrate example signals generated by the first sensor 115 and/or the second sensor 120 according to an exemplary embodiment of the present disclosure. The example signals can be based on first and second magnetic field components sensed by the first sensor 115 and/or the second sensor 120.

In operation, the toothed wheel 105 rotates and passes the sensors 115 and/or 120 of the magnetoresistive device 100 along the X-direction (e.g., the left direction in FIG. 2A as indicated by the arrow above the toothed wheel 105). The teeth of the tooth wheel 105 define and/or influence magnetic field components generated by the magnets 130, and/or the magnetic poles of the toothed wheel 105 generate the magnetic field components. In these examples, the magnetic field components include a magnetic field component that extends between adjacent North and South poles (e.g., magnetic field component $H_X$) and a magnetic field component that extends inwardly or outwardly along the pole from the center of the pole (e.g., magnetic field component $H_Z$).

As the teeth of the toothed wheel 105 travel past the sensors 115/120, the sensors 115 and/or 120 can be configured to sense changes in the magnetic field component $H_X$ and changes in the magnetic field component $H_Z$ using one or more magnetoresistive sensors. For example, the sensors 115 and 120 can each include four magnetoresistive sensors—two magnetoresistive sensors (e.g., X1 and X2) configured to sense changes in the magnetic field component $H_X$ and two magnetoresistive sensors (e.g., Z1 and Z2) configured to sense changes in the magnetic field component $H_Z$. In this example, the sensors 115 and 120 can each be referred to as a magnetoresistive sensor quadruple.

Figure 2B:
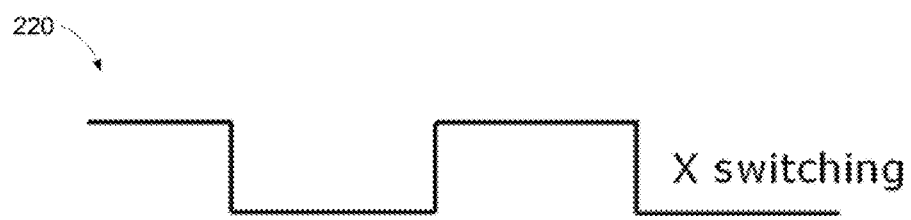
FIGS. 2B and 2C illustrate example signals generated sensors of a magnetoresistive device according to an exemplary embodiment of the present disclosure.

FIG. 2B illustrates a signal 220 generated by magnetoresistive sensors configured to sense changes in the magnetic field component $H_X$. For example, rising edges of the signal correspond to the magnetic field component extending from a North Pole to an adjacent South Pole in the direction in which the toothed wheel 105 passes the sensors 115/120, and falling edges of the signal correspond to the magnetic field component extending from a North Pole to an adjacent South Pole in the opposite direction in which the toothed wheel 105 passes the sensors 115/120.

Figure 2C:
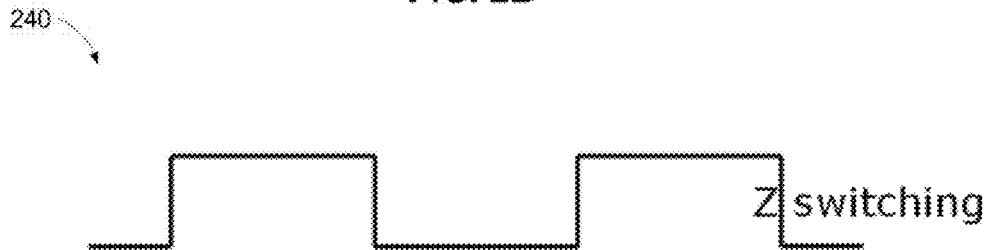

FIG. 2C illustrates a signal 240 generated by magnetoresistive sensors configured to sense changes in the magnetic field component $H_Z$. For example, rising edges of the signal correspond to the magnetic field component extending outward from the center of the North Poles of the toothed wheel 105 towards, for example, magnetoresistive sensor Z1, and falling edges of the signal correspond to the magnetic field component extending inward to the center of the South Poles of the toothed wheel 105 and away from, for example, magnetoresistive sensor Z1.

Figure 3:
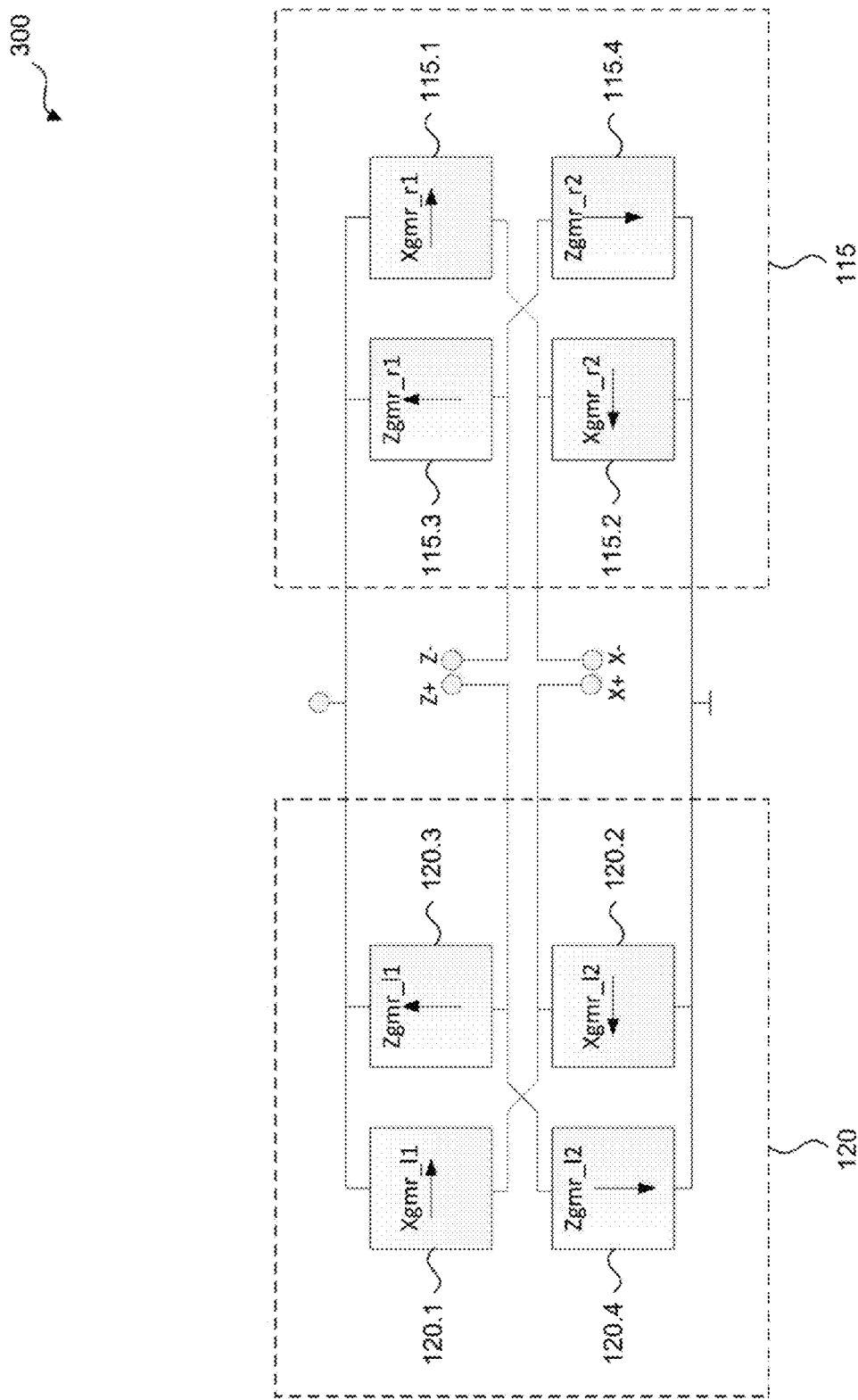
FIGS. 3-7 illustrate magnetoresistive devices according to exemplary embodiments of the present disclosure.

FIG. 3 illustrates a magnetoresistive device 300 according to an exemplary embodiment of the present disclosure.

The magnetoresistive device 300 can include sensors 115 and 120 electrically connected to each other. In an exemplary embodiment, the sensor 115 includes four magnetoresistive sensors 115.1 to 115.4, and sensor 120 includes four magnetoresistive sensors 120.1 to 120.4. The sensors 115 and 120 are not limited to each having four magnetoresistive sensors and sensor 115 and/or sensor 120 can have a different number of magnetoresistive sensors as would be understood by those skilled in the relevant arts. The magnetoresistive sensors 115.1 to 115.4 and/or the magnetoresistive sensors 120.1 to 120.4 can be electrically connected in a Wheatstone bridge configuration.

The magnetoresistive sensors 115.1 and 115.2 can be configured to sense a first magnetic field component and magnetoresistive sensors 115.3 and 115.4 are configured to sense a second magnetic field component different from the first magnetic field component. For example, the magnetoresistive sensors 115.1 and 115.2 can be configured to sense the magnetic field component $H_X$ and the magnetoresistive sensors 115.3 and 115.4 can be configured to sense the magnetic field component $H_Z$.

The magnetoresistive sensor 115.1 can be configured to sense magnetic field component $H_X$ with respect to positive X-direction (e.g., $+H_X$) and the magnetoresistive sensor 115.2 can be configured to sense magnetic field component $H_X$ with respect to the negative X-direction (e.g., $-H_X$). For example, the resistance of magnetoresistive sensor 115.1 can increase as the magnetic field component $H_X$ increases and the resistance of the magnetoresistive sensor 115.2 can decrease as the magnetic field component $H_X$ increases. In this example, a signal generated by the magnetoresistive sensor 115.1 in response to the magnetic field component $H_X$ can increase while a signal generated by the magnetoresistive sensor 115.2 in response to the magnetic field component $H_X$ can decrease. In other words, the signals generated by the magnetoresistive sensor 115.1 has a positive magnetic field coefficient, while the magnetoresistive sensor 115.2 has a negative magnetic field coefficient analogue to positive and negative temperature coefficients known to someone of ordinary skill in the art. Such a relationship of the signals generated by magnetoresistive sensor 115.1 with positive magnetic field coefficient and magnetoresistive sensor 115.2 with negative magnetic field coefficient may be referred to in this disclosure as an inverse relationship of the signals generated by the magnetoresistive sensors 115.1 and 115.2.

Similarly, the magnetoresistive sensor 115.3 can be configured to sense magnetic field component $H_Z$ with respect to the positive Z-direction (e.g., $+H_Z$) and the magnetoresistive sensor 115.4 can be configured to sense magnetic field component $H_Z$ with respect to the negative Z-direction (e.g., $-H_Z$). For example, the resistance of magnetoresistive sensor 115.3 can increase as the magnetic field component $H_Z$ increases and the resistance of the magnetoresistive sensor 115.4 can decrease as the magnetic field component $H_Z$ increases. In this example, a signal generated by the magnetoresistive sensor 115.3 in response to the magnetic field component $H_Z$ can increase while a signal generated by the magnetoresistive sensor 115.4 in response to the magnetic field component $H_Z$ can decrease. In other words the magnetoresistive sensor 115.3 has a positive magnetic field coefficient, while the magnetoresistive sensor 115.4 has a negative magnetic field coefficient. As before, such a relationship of the signals generated by magnetoresistive sensors 115.3 and 115.4 may be referred to in this disclosure as an inverse relationship.

In these configurations, the signals generated by the magnetoresistive sensors 115.1 and 115.2 can be used to determine a "local" magnetic field differential of the magnetic field component $H_X$ based on $+H_X$ and $-H_X$ within the first sensing area. The signals generated by the magnetoresistive sensors 115.3 and 115.4 can be used to determine a "local" magnetic field differential of the magnetic field component $H_Z$ based on $+H_Z$ and $-H_Z$ within the first sensing area.

The signals generated by the magnetoresistive sensors 120.1 to 120.4 can be similarly used to determine "local" magnetic field differentials within the second sensing area. For example, the magnetoresistive sensor 120.1 can be configured to sense magnetic field component $H_X$ with respect to the positive X-direction (e.g., $+H_X$) and the magnetoresistive sensor 120.2 can be configured to sense magnetic field component $H_X$ with respect to the negative X-direction (e.g., $-H_X$). The magnetoresistive sensor 120.3 can be configured to sense magnetic field component $H_Z$ with respect to the positive Z-direction (e.g., $+H_Z$) and the magnetoresistive sensor 120.4 can be configured to sense magnetic field component $H_Z$ with respect to the negative Z-direction (e.g., $-H_Z$) within the second sensing area. In these configurations, the signals generated by the magnetoresistive sensors 120.1 and 120.2 can be used to determine a "local" magnetic field differential of the magnetic field component $H_X$ based on $+H_X$ and $-H_X$ and the signals generated by the magnetoresistive sensors 120.3 and 120.4 can be used to determine a "local" magnetic field differential of the magnetic field component $H_Z$ based on $+H_Z$ and $-H_Z$, both in the second sensing area.

In these examples, signals generated by the magnetoresistive sensors 115.1 to 115.4 can be used to determine "local" magnetic field differentials at the first sensor 115, and signals generated by the magnetoresistive sensors 120.1 to 120.4 can be used to determine other "local" magnetic field differentials at the second sensor 120. Further, the signals generated by the first sensor 115 and the second sensor 120 can be used to determine "global" differentials between the magnetic field components sensed by the first sensor 115 and the magnetic field components sensed by the second sensor 120.

The magnetoresistive device 300 can include one or more evaluating devices (not shown) connected to the leads (e.g., Z+, Z−, X+, X−) of the magnetoresistive device 300, and configured to process one or more signals generated by one or more of the magnetoresistive sensors 115.1 to 115.4 and/or 120.1 to 120.4. The evaluating device(s) can include memory that stores data and/or instructions, and processor circuitry that is configured to process one or more of the signals generated one or more of the magnetoresistive sensors 115.1 to 115.4 and/or 120.1 to 120.4. The processor circuitry can also be configured to determine rotational direction and/or rotational speed of an indicator object 105 based on the processed signal(s), and/or to determine one or more "local" and/or "global" differentials based on the signals generated by the magnetoresistive sensors 115.1 to 115.4 and/or 120.1 to 120.4.

Figure 4:
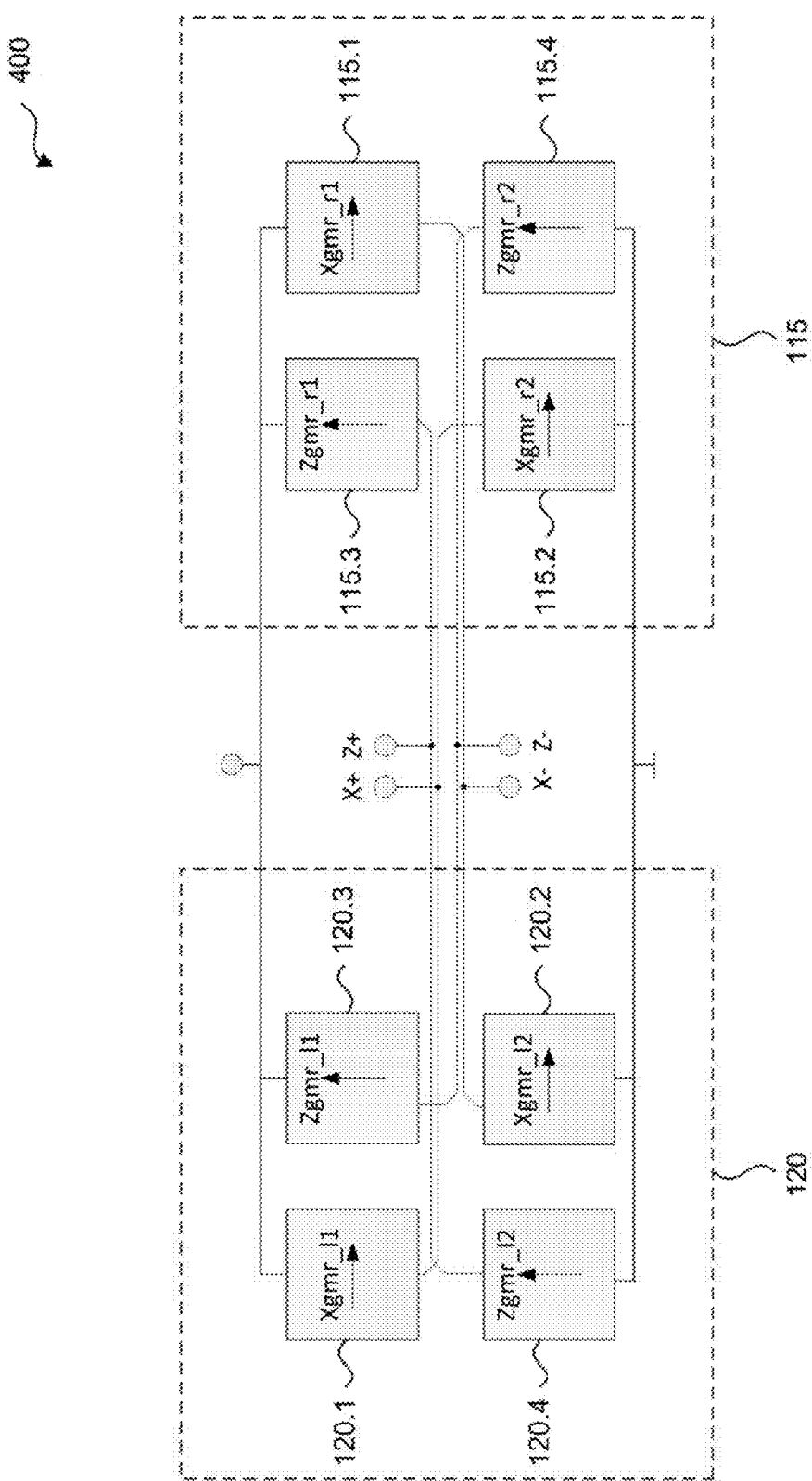

FIG. 4 illustrates a magnetoresistive device 400 according to an exemplary embodiment of the present disclosure.

The magnetoresistive device 400 can include sensors 115 and 120 electrically connected to each other. The sensor 115 can include four magnetoresistive sensors 115.1 to 115.4, and sensor 120 can include four magnetoresistive sensors 120.1 to 120.4. The sensors 115 and 120 are not limited to each having four magnetoresistive sensors and sensor 115 and/or sensor 120 can have a different number of magnetoresistive sensors as would be understood by those skilled in the relevant arts. The magnetoresistive sensors 115.1 to 115.4 and/or the magnetoresistive sensors 120.1 to 120.4 can be electrically connected in a Wheatstone bridge configuration.

The magnetoresistive sensors 115.1 and 115.2 can be configured to sense a first magnetic field component and magnetoresistive sensors 115.3 and 115.4 can be configured to sense a second magnetic field component different from the first magnetic field component. For example, the magnetoresistive sensors 115.1 and 115.2 can be configured to sense the magnetic field component $H_X$ and the magnetoresistive sensors 115.3 and 115.4 can be configured to sense the magnetic field component $H_Z$.

The magnetoresistive sensors 115.1 and 115.2 can be configured to sense magnetic field component $H_X$ with respect to the positive X-direction (e.g., $+H_X$) and magnetoresistive sensors 115.3 and 115.4 can be configured to sense magnetic field component $H_Z$ with respect to the positive Z-direction (e.g., $+H_Z$). For example, the resistance of magnetoresistive sensor 115.1 can increase as the magnetic field component $H_X$ increases and the resistance of the magnetoresistive sensor 115.2 can increase as the magnetic field component $H_X$ increases. In this example, a signal generated by the magnetoresistive sensor 115.1 in response to the magnetic field component $H_X$ can increase and a signal generated by the magnetoresistive sensor 115.2 in response to the magnetic field component $H_X$ can also increase. Similarly, the resistance of magnetoresistive sensor 115.3 can increase as the magnetic field component $H_Z$ increases and the resistance of the magnetoresistive sensor 115.4 can increase as the magnetic field component $H_Z$ increases. In this example, a signal generated by the magnetoresistive sensor 115.3 in response to the magnetic field component $H_Z$ can increase and a signal generated by the magnetoresistive sensor 115.4 in response to the magnetic field component $H_Z$ can also increase. In other words, the signals generated by the magnetoresistive sensors 115.1 and 115.2 have positive magnetic field coefficients. Such a relationship of the signals generated by magnetoresistive sensor 115.1 and 115.2 may be referred to in this disclosure as a direct relationship. Similarly, the relationship of the signals generated by magnetoresistive sensor 115.3 and 115.4 having positive magnetic field coefficients may also be referred to as a direct relationship.

Similarly, the magnetoresistive sensors 120.1 and 120.2 can be configured to sense magnetic field component $H_X$ with respect to the positive X-direction (e.g., $+H_X$) the magnetoresistive sensors 120.3 and 120.4 can be configured to sense magnetic field component $H_Z$ with respect to the positive Z-direction (e.g., $+H_Z$).

For example, the resistance of magnetoresistive sensor 120.1 can increase as the magnetic field component $H_X$ increases and the resistance of the magnetoresistive sensor 120.2 can increase as the magnetic field component $H_X$ increases. Similarly, the resistance of magnetoresistive sensor 120.3 can increase as the magnetic field component $H_Z$ increases and the resistance of the magnetoresistive sensor 120.4 can increase as the magnetic field component $H_Z$ increases. That is, the signals generated by the magnetoresistive sensors 120.1 and 120.2 can have a direct relationship, and signals generated by the magnetoresistive sensors 120.3 and 120.4 can also have a direct relationship.

In these examples, signals generated by the magnetoresistive sensors 115.1 and 115.2 and the signals generated by the magnetoresistive sensors 120.1 and 120.2 can be used to determine "global" differentials between the magnetic field components sensed by the first sensor 115 and the second sensor 120. Similarly, signals generated by the magnetoresistive sensors 115.3 and 115.4 and the signals generated by the magnetoresistive sensors 120.3 and 120.4 can be used to determine "global" differentials between the magnetic field components sensed by the first sensor 115 and the second sensor 120.

The magnetoresistive device 400 can include one or more evaluating devices (not shown) connected to the leads (e.g., Z+, Z−, X+, X−) of the magnetoresistive device 300, and configured to process one or more signals generated by one or more of the magnetoresistive sensors 115.1 to 115.4 and/or 120.1 to 120.4. The evaluating device(s) can include memory that stores data and/or instructions, and processor circuitry that is configured to process one or more of the signals generated one or more of the magnetoresistive sensors 115.1 to 115.4 and/or 120.1 to 120.4. The processor circuitry can also be configured to determine rotational direction and/or rotational speed of an indicator object 105 based on the processed signal(s), and/or to determine one or more "global" differentials between the magnetic field components sensed by the magnetoresistive sensors of sensor 115 and the magnetic field components sensed by the magnetoresistive sensors of sensor 120.

Figure 5:
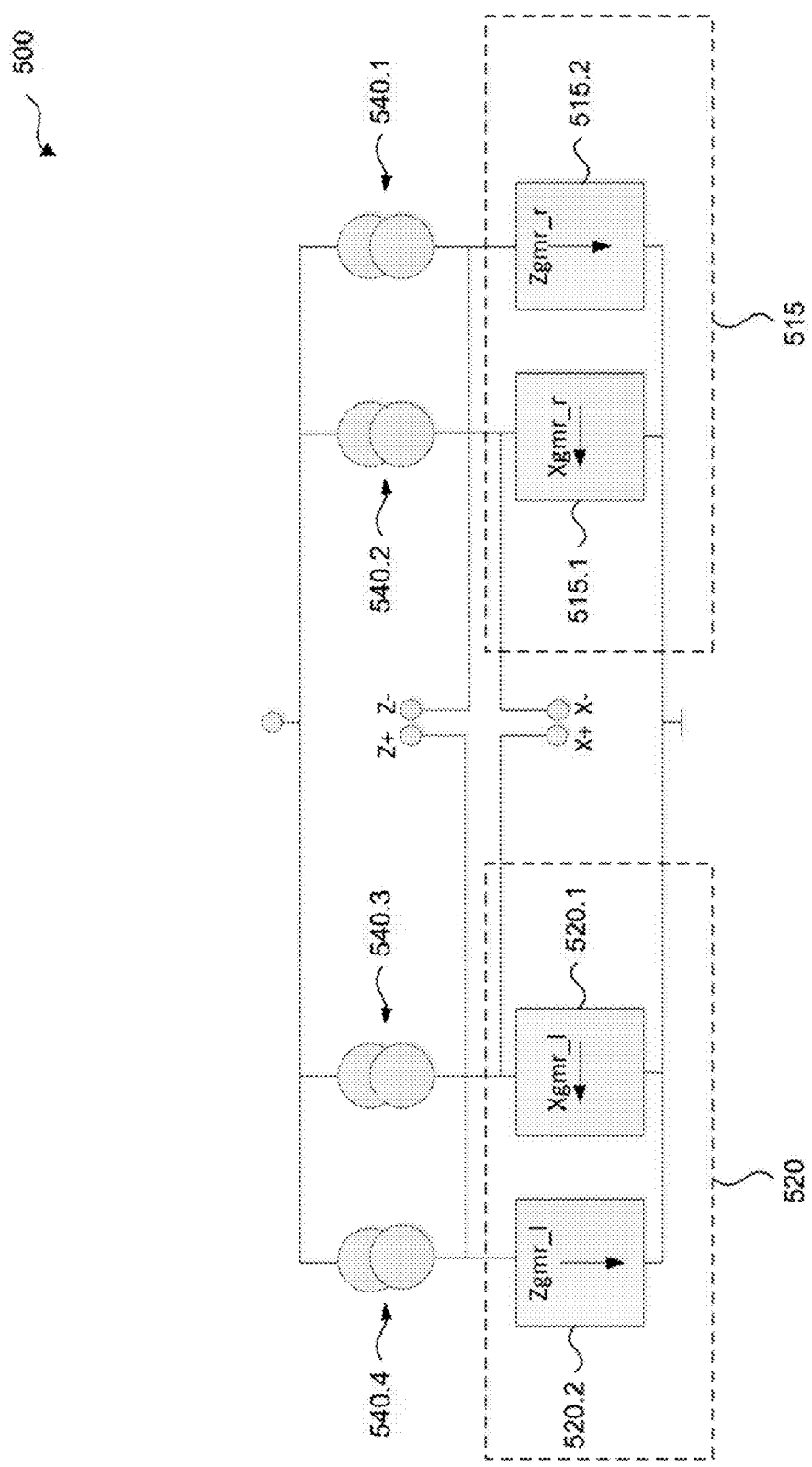

FIG. 5 illustrates a magnetoresistive device 500 according to an exemplary embodiment of the present disclosure.

The magnetoresistive device 500 can include current sources 540.1 to 540.4 and sensors 515 and 520 electrically connected to each other. For example, current sources 540.1 and 540.2 can be connected to sensor 515 and current sources 540.3 and 540.4 can be connected to sensor 520.

The sensor 515 can include two magnetoresistive sensors 515.1 and 515.2, and sensor 520 can include two magnetoresistive sensors 520.1 and 520.2. Sensor 515.1 can be connected in series to current source 540.1, sensor 515.2 can be connected in series to current source 540.2, sensor 515.1 can be connected in series to current source 540.3, and sensor 520.2 can be connected in series to current source 540.4. The sensors 515 and/or 520 are not limited to having two magnetoresistive sensors and the magnetoresistive device 500 can include a different number of current sources. The magnetoresistive sensors 515.1, 515.2, 520.1, and 520.2 can be electrically connected in a Wheatstone bridge configuration.

The current sources 540.1 to 540.4 can be configured to generate one or more constant or variable currents. In an exemplary embodiment, current sources 540.1 to 540.4 are configured to generate the same current. In another embodiment, one or more of the current sources 540.1 to 540.4 can generate a different current than one or more of the other of the current sources.

Magnetoresistive sensors 515.1 and 520.1 can be configured to sense a first magnetic field component and magnetoresistive sensors 515.2 and 520.2 can be configured to sense a second magnetic field component different from the first magnetic field component. For example, the magnetoresistive sensors 515.1 and 520.1 can be configured to sense the magnetic field component $H_X$ and the magnetoresistive sensors 515.2 and 520.2 can be configured to sense the magnetic field component $H_Z$.

The magnetoresistive sensors 515.1 and 520.1 can be configured to sense magnetic field component $H_X$ with respect to the negative X-direction (e.g., $-H_X$) and magnetoresistive sensors 515.2 and 520.2 can be configured to sense magnetic field component $H_Z$ with respect to the negative Z-direction (e.g., $-H_Z$).

In this example, signals generated by the magnetoresistive sensors 515.1 and 520.1 can be used to determine "global" differentials between the respective magnetic field components $H_X$ sensed by the first sensor 515 and the second sensor 520. Similarly, the magnetoresistive sensors 515.2 and 520.2 can be used to determine "global" differentials between the respective magnetic field components $H_Z$ sensed by the first sensor 515 and the second sensor 520.

The magnetoresistive device 500 can include one or more evaluating devices connected to the leads (e.g., Z+, Z−, X+, X−) of the magnetoresistive device 500, and configured to process one or more signals generated by one or more of the magnetoresistive sensors 515.1, 515.2, 520.1, and 520.2. The evaluating device(s) can include memory that stores data and/or instructions, and processor circuitry that is configured to process one or more of the signals generated one or more of the magnetoresistive sensors 515.1, 515.2, 520.1, and 520.2. The processor circuitry can also be configured to determine rotational direction and/or rotational speed of an indicator object 105 based on the processed signal(s), and/or to determine one or more "global" differentials based on the signals generated by the magnetoresistive sensors of sensors 515 and 520.

Figure 6:
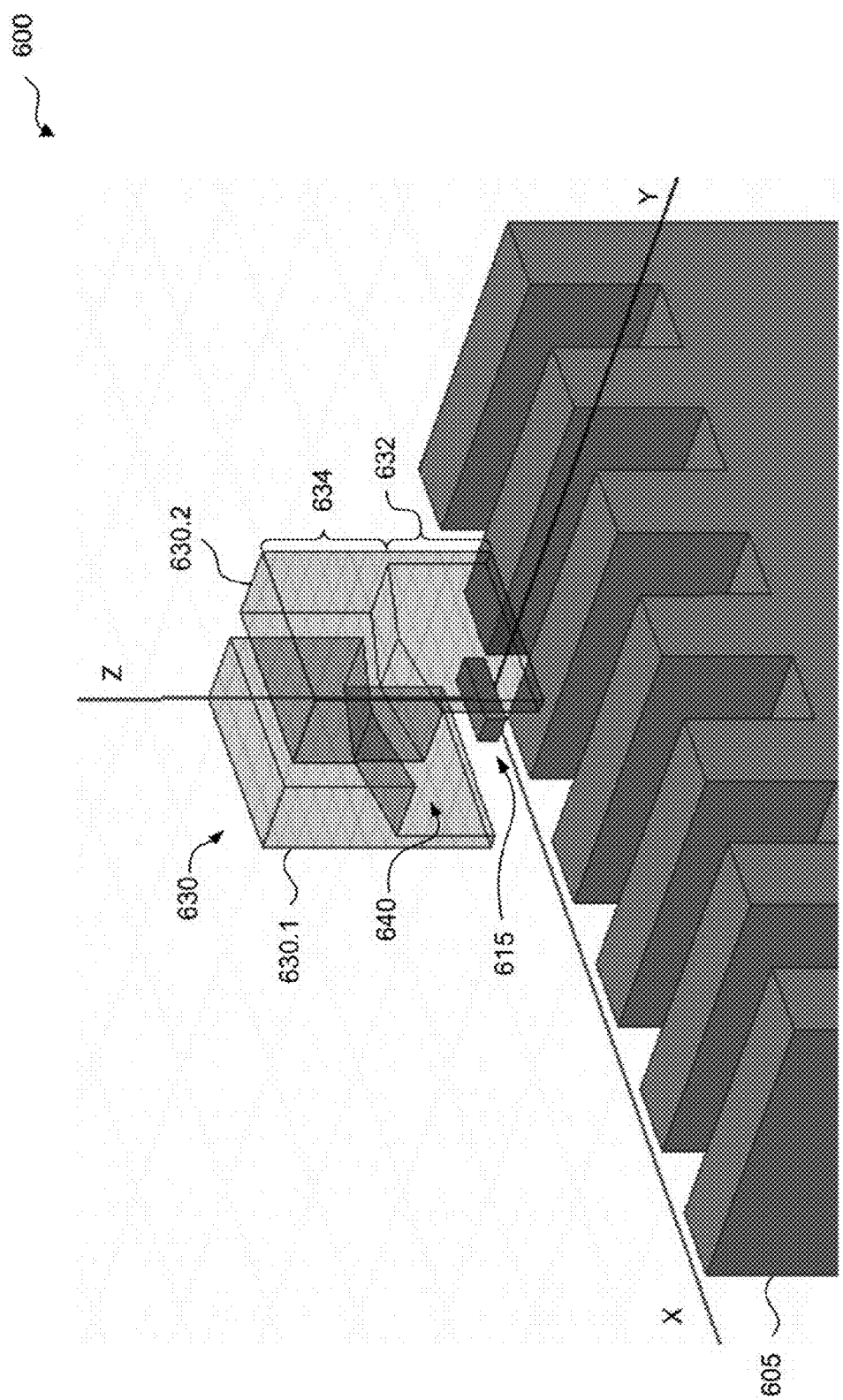

FIG. 6 illustrates a magnetoresistive device 600 according to an exemplary embodiment of the present disclosure.

The magnetoresistive device 600 can include a magnet 630 having a cavity 640 formed therein, and a sensor 615 adjacent to the cavity 640 and/or at least partially located within the cavity 640. The magnet 630 can include a first portion 630.1 and a second portion 630.2 that cooperatively form the cavity 640. The first portion 630.1 and the second portion 630.2 can be mirror images of each other, or can be different. The first portion 630.1 and the second portion 630.2 can be referred to as opposing segments of the magnet 630. The sensor 615 can be an exemplary embodiment of the sensors 100, 200, 300, 400, and/or 500.

The magnet 630 can be a back-biasing magnet configured to generate a magnetic field H that can be defined and/or influenced by indicator object 605 arranged adjacent to, and spaced from the magnetoresistive device 600. The magnet 630 can be magnetized in a magnetization direction that extends in the Z-direction. However, the magnet 630 can be magnetized in one or more other directions as would be understood by one of ordinary skill in the relevant arts.

The sensor 615 can be configured sense a first magnetic field component and a second magnetic field component. The first magnetic field component can be orthogonal (or substantially orthogonal) to the second magnetic field component. For example, the first magnetic field component can extend in the X-direction and the second magnetic field component can extend in the Z-direction, which is orthogonal to the X-direction. In this example, the first magnetic field component can be referred to as $H_X$ and the second magnetic field component can be referred to as $H_Z$. In other embodiments, the first and second magnetic field components can extend in other directions as would be understood by one of ordinary skill in the relevant arts.

The cavity 640 of the magnet 630 can be formed to have dimensions that result in reduced magnetic field conditions of the magnetic field H in proximity to the cavity 640 and/or within the cavity 640. For example, the cavity 640 can be defined to generate a reduced first magnetic field component $H_X$ and a reduced magnetic field component $H_Z$. The generation of the reduced magnetic field conditions can prevent the magnetoresistive sensor 615 from entering (magnetic) saturation when the magnetoresistive sensor 615 is within the magnetic field H.

The first portion 630.1 and/or the second portion 630.2 of the magnet 630 can include a thin-walled portion 632 and a thick-walled portion 634 having a thickness greater than a thickness of the thin-walled portion 632. The thickness can be defined along the Y-direction as illustrated in FIG. 6.

The thin-walled portion 632 can define a sidewall of the cavity 640. The portion of the cavity 640 defined by the thin-walled portion 632 can be referred to as a base cavity portion. The base cavity portion can be, for example, a rectangular prism defined on two sides by the thin-walled portion 632 of the first portion 630.1 and the thin-walled portion 632 of the second portion 630.2.

The bottom of the thick-walled portion 634 can define a triangular prism-shaped cavity portion of the cavity 640. The triangular prism-shaped cavity portion can be formed where the thick-walled portion 634 abuts a corresponding thin-walled portion 632. In this configuration, the triangular prism-shaped cavity portion is disposed on (in the Z-direction) the base cavity portion defined by the thin-walled portion 632.

The sensor 615 can be located adjacent to and/or at least partially within the base cavity portion of the cavity 640 at the bottom of the base cavity portion in the Z-direction.

Figure 7:
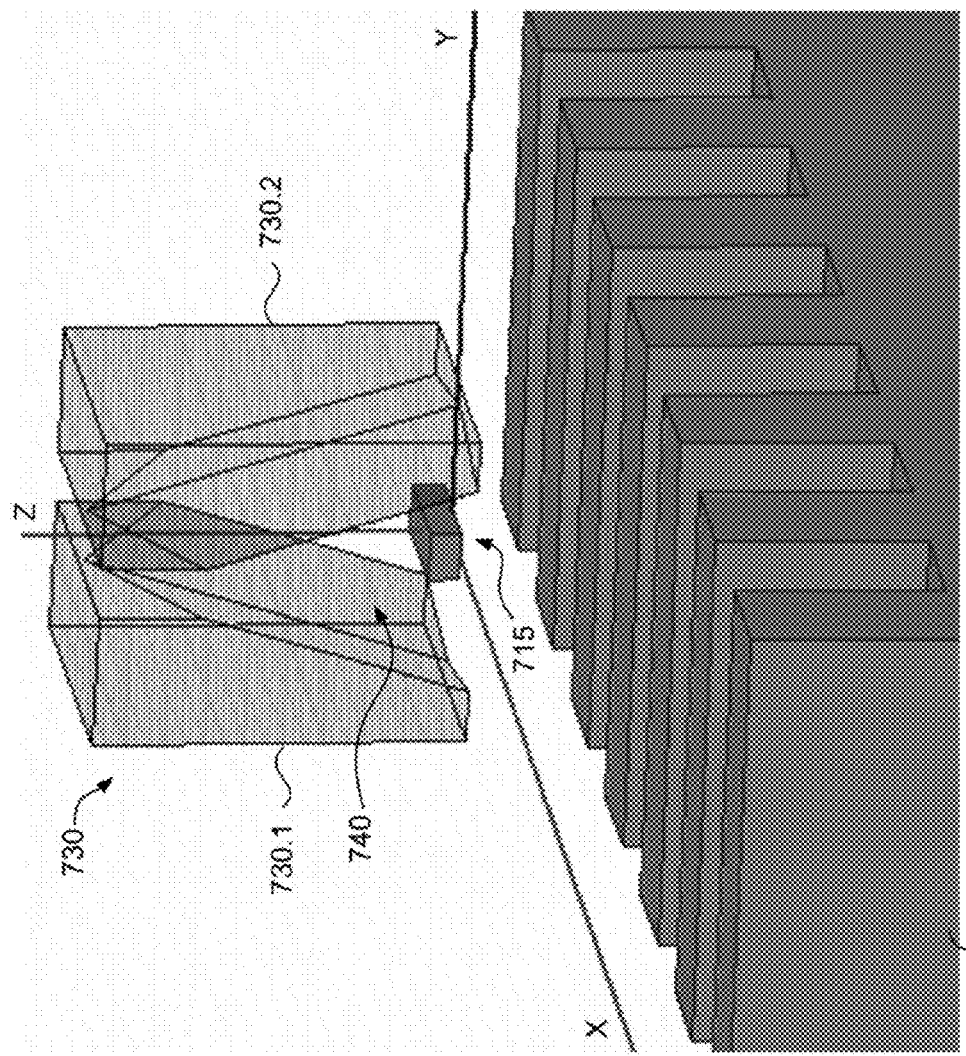

FIG. 7 illustrates a magnetoresistive device 700 according to an exemplary embodiment of the present disclosure.

The magnetoresistive device 700 can include a magnet 730 having a cavity 740 formed therein, and a sensor 715 adjacent to the cavity 740 and/or at least partially located within the cavity 740. The magnet 730 can include a first portion 730.1 and a second portion 730.2 that cooperatively form the cavity 740. The first portion 730.1 and the second portion 730.2 can be mirror images of each other, or can be different. The first portion 730.1 and the second portion 630 can be referred to as opposing segments of the magnet 730. The sensor 715 can be an exemplary embodiment of the sensors 100, 200, 300, 400, and/or 500.

The magnet 730 can be a back-biasing magnet configured to generate a magnetic field H that can be defined and/or influenced by indicator object 705 arranged adjacent to, and spaced from the magnetoresistive device 700. The magnet 730 can be magnetized in a magnetization direction that extends in the Z-direction. However, the magnet 730 can be magnetized in one or more other directions as would be understood by one of ordinary skill in the relevant arts.

The sensor 715 can be configured sense a first magnetic field component and a second magnetic field component. The first magnetic field component can be orthogonal (or substantially orthogonal) to the second magnetic field component. For example, the first magnetic field component can extend in the X-direction and the second magnetic field component can extend in the Z-direction, which is orthogonal to the X-direction. In this example, the first magnetic field component can be referred to as $H_X$ and the second magnetic field component can be referred to as $H_Z$. In other embodiments, the first and second magnetic field components and corresponding sensing planes can extend in other directions as would be understood by one of ordinary skill in the relevant arts.

The cavity 740 of the magnet 730 can be formed to have dimensions that result in reduced magnetic field conditions of the magnetic field H in proximity to the cavity 740 and/or within the cavity 740. For example, the cavity 740 can be defined to generate a reduced first magnetic field component $H_X$ and a reduced magnetic field component $H_Z$. The generation of such reduced magnetic field conditions can prevent the magnetoresistive sensor 715 from entering (magnetic) saturation when the magnetoresistive sensor 715 is within the magnetic field H.

The cavity 740 can be pyramid shaped and the first portion 730.1 and the second portion 730.2 of the magnet 730 can each be configured to define two faces of the pyramid-shaped cavity 640. The base of the pyramid-shaped cavity 740 can be located within the X-Y plane and the faces of the pyramid-shaped cavity 740 extend from the base to the apex of the pyramid-shaped cavity 740 in the Z-direction. That is, the height of the pyramid-shaped cavity 740 is defined along the Z-axis.

Figure 8:
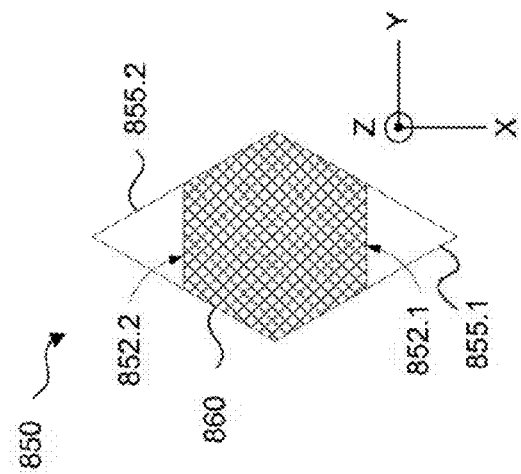
FIG. 8 illustrates a plan view of a base of a cavity defined by a magnet according to an exemplary embodiment of the present disclosure.

With reference to FIG. 8, the base 850 of the pyramid-shaped cavity 740 can be a non-self-intersecting quadrilateral-shaped base (e.g., a rhombus, a diamond, etc.). Two portions 855.1 and 855.2 of the base 850 and corresponding face portions extending in the Z-direction therefrom can be located outside of the magnet 740. In this example, the resulting base 860 within the cavity 740 is hexagonally shaped as shown in FIG. 8 and emphasized by cross-hatching. Further, each of the first and second portions 730.1 and 730.2 of the magnet 730 can define two faces of the cavity 740 that extend to the apex, and the corresponding faces extending from edges 852.1 and 852.2 can extend vertically along the Z-direction.

Conclusion

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, code, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to embodiments described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

What is claimed is:

1. A magnetoresistive device, comprising:
   a first magnetoresistive sensor sensitive to a first magnetic field component of a magnetic field;
   a second magnetoresistive sensor sensitive to the first magnetic field component;
   a third magnetoresistive sensor sensitive to a second magnetic field component of the magnetic field;
   a fourth magnetoresistive sensor sensitive to the second magnetic field component, wherein the first magnetoresistive sensor, the second magnetoresistive sensor, the third magnetoresistive sensor, and the fourth magnetoresistive sensor are arranged in a first sensing area;
   a fifth magnetoresistive sensor sensitive to the first magnetic field component;
   a sixth magnetoresistive sensor sensitive to the first magnetic field component;
   a seventh magnetoresistive sensor sensitive to the second magnetic field component; and
   an eighth magnetoresistive sensor sensitive to the second magnetic field component, wherein the fifth magnetoresistive sensor, the sixth magnetoresistive sensor, the seventh magnetoresistive sensor, and the eighth magnetoresistive sensor are arranged in a second sensing area that is spaced apart from the first sensing area, wherein the first, second, fifth and sixth magnetoresistive sensors are connected to form a first Wheatstone bridge that is configured to determine a magnetic field differential of the first magnetic field component and wherein the third, fourth, seventh and eighth magnetoresistive sensors are connected to form a second Wheatstone bridge that is configured to determine a magnetic field differential of the second magnetic field component.

2. The magnetoresistive device of claim 1, further comprising:
a biasing magnet arranged relative to the first sensing area, the biasing magnet being configured to reduce magnetic field conditions within the first sensing area.

3. The magnetoresistive device of claim 1, wherein:
the first magnetoresistive sensor and the second magnetoresistive sensor are configured to have an inverse relationship;
the third magnetoresistive sensor and the fourth magnetoresistive sensor are configured to have an inverse relationship;
the fifth magnetoresistive sensor and the sixth magnetoresistive sensor are configured to have an inverse relationship; and
the seventh magnetoresistive sensor and the eighth magnetoresistive sensor are configured to have an inverse relationship.

4. The magnetoresistive device of claim 1, wherein:
the first magnetoresistive sensor and the second magnetoresistive sensor are configured to have a direct relationship;
the third magnetoresistive sensor and the fourth magnetoresistive sensor are configured to have a direct relationship;
the fifth magnetoresistive sensor and the sixth magnetoresistive sensor are configured to have an inverse relationship; and
the seventh magnetoresistive sensor and the eighth magnetoresistive sensor are configured to have an inverse relationship.

5. The magnetoresistive device of claim 1, wherein the first magnetic field component is orthogonal to the second magnetic field component.

6. The magnetoresistive device of claim 1, wherein:
a signal generated by the first magnetoresistive sensor decreases while a signal generated by the second magnetoresistive sensor increases or the signal generated by the first magnetoresistive sensor increases while the signal generated by the second magnetoresistive sensor decreases in response to the first magnetic field component;
a signal generated by the fifth magnetoresistive sensor decreases while a signal generated by the sixth magnetoresistive sensor increases or the signal generated by the fifth magnetoresistive sensor increases while the signal generated by the sixth magnetoresistive sensor decreases in response to the first magnetic field component;
a signal generated by the third magnetoresistive sensor decreases while a signal generated by the fourth magnetoresistive sensor increases or the signal generated by the third magnetoresistive sensor increases while the signal generated by the fourth magnetoresistive sensor decreases in response to the second magnetic field component; and
a signal generated by the seventh magnetoresistive sensor decreases while a signal generated by the eighth magnetoresistive sensor increases or the signal generated by the seventh magnetoresistive sensor increases while the signal generated by the eighth magnetoresistive sensor decreases in response to the second magnetic field component.

7. The magnetoresistive device of claim 1, wherein:
both a signal generated by the first magnetoresistive sensor and a signal generated by the second magnetoresistive sensor increase or decrease in response to the first magnetic field component;
both a signal generated by the fifth magnetoresistive sensor and a signal generated by the sixth magnetoresistive sensor increase or decrease in response to the first magnetic field component;
both a signal generated by the third magnetoresistive sensor and a signal generated by the fourth magnetoresistive sensor increase or decrease in response to the second magnetic field component; and
both a signal generated by the seventh magnetoresistive sensor and a signal generated by the eighth magnetoresistive sensor increase or decrease in response to the second magnetic field component.

8. The magnetoresistive device of claim 1, wherein:
a resistance of the first magnetoresistive sensor and a resistance of the second magnetoresistive sensor have an inverse relationship in response to the first magnetic field component;
a resistance of the third magnetoresistive sensor and a resistance of the fourth magnetoresistive sensor have an inverse relationship in response to the second magnetic field component;
a resistance of the fifth magnetoresistive sensor and a resistance of the sixth magnetoresistive sensor have an inverse relationship in response to the first magnetic field component; and
a resistance of the seventh magnetoresistive sensor and a resistance of the eighth magnetoresistive sensor have an inverse relationship in response to the second magnetic field component.

9. The magnetoresistive device of claim 1, wherein:
a resistance of the first magnetoresistive sensor and a resistance of the second magnetoresistive sensor have a direct relationship in response to the first magnetic field component;
a resistance of the third magnetoresistive sensor and a resistance of the fourth magnetoresistive sensor have a direct relationship in response to the second magnetic field component;
a resistance of the fifth magnetoresistive sensor and a resistance of the sixth magnetoresistive sensor have a direct relationship in response to the first magnetic field component; and
a resistance of the seventh magnetoresistive sensor and a resistance of the eighth magnetoresistive sensor have a direct relationship in response to the second magnetic field component.

10. The magnetoresistive device of claim 1, wherein the magnetoresistive device is configured in a first half bridge between the first magnetoresistive sensor and the fifth magnetoresistive sensor and in a second half bridge between the second magnetoresistive sensor and the sixth magnetoresistive sensor.

11. The magnetoresistive device of claim 10, wherein the magnetoresistive device is configured in a third half bridge between the third magnetoresistive sensor and the seventh magnetoresistive sensor and in a fourth half bridge between the fourth magnetoresistive sensor and the eighth magnetoresistive sensor.

12. The magnetoresistive device of claim 1, wherein the magnetoresistive device is a speed sensor.

13. The magnetoresistive device of claim 12, wherein the magnetoresistive device is configured to generate a signal indicative of a rotational speed.

14. The magnetoresistive device of claim 13, wherein the magnetoresistive device is configured to generate a signal indicative of a rotational direction.

15. The magnetoresistive device of claim 12, wherein the magnetoresistive device is configured to generate a signal indicative of a rotational direction.

16. A magnetoresistive device, comprising:
- a first magnetoresistive sensor sensitive to a first magnetic field component of a magnetic field;
- a second magnetoresistive sensor sensitive to the first magnetic field component;
- a third magnetoresistive sensor sensitive to a second magnetic field component of the magnetic field;
- a fourth magnetoresistive sensor sensitive to the second magnetic field component, wherein the first magnetoresistive sensor, the second magnetoresistive sensor, the third magnetoresistive sensor, and the fourth magnetoresistive sensor are arranged in a first sensing area;
- a fifth magnetoresistive sensor sensitive to the first magnetic field component;
- a sixth magnetoresistive sensor sensitive to the first magnetic field component;
- a seventh magnetoresistive sensor sensitive to the second magnetic field component; and
- an eighth magnetoresistive sensor sensitive to the second magnetic field component, wherein the fifth magnetoresistive sensor, the sixth magnetoresistive sensor, the seventh magnetoresistive sensor, and the eighth magnetoresistive sensor are arranged in a second sensing area that is spaced apart from the first sensing area wherein:
  - the first, second, fifth and sixth magnetoresistive sensors are connected to form a first Wheatstone bridge; and
  - the third, fourth, seventh and eighth magnetoresistive sensors are connected to form a second Wheatstone bridge.

17. The magnetoresistive device of claim 16, wherein the first Wheatstone bridge is configured to determine a magnetic field differential of the first magnetic field component and the second Wheatstone bridge is configured to determine a magnetic field differential of the second magnetic field component.

18. The magnetoresistive device of claim 16, wherein the first magnetic field component is orthogonal to the second magnetic field component.

* * * * *